United States Patent
Pregenzer

(10) Patent No.: US 11,954,640 B2
(45) Date of Patent: Apr. 9, 2024

(54) CONTAINER FOR A GOODS MANAGEMENT SYSTEM

(71) Applicant: Lukas Pregenzer, Mieming (AT)

(72) Inventor: Lukas Pregenzer, Mieming (AT)

( * ) Notice: Subject to any disclaimer, the term of this patent is extended or adjusted under 35 U.S.C. 154(b) by 253 days.

(21) Appl. No.: 17/630,173

(22) PCT Filed: Jul. 15, 2020

(86) PCT No.: PCT/EP2020/069939
§ 371 (c)(1),
(2) Date: Jan. 26, 2022

(87) PCT Pub. No.: WO2021/018579
PCT Pub. Date: Feb. 4, 2021

(65) Prior Publication Data
US 2022/0277258 A1    Sep. 1, 2022

(30) Foreign Application Priority Data
Jul. 30, 2019   (AT) ............... A 50693/2019

(51) Int. Cl.
*G06Q 10/087*    (2023.01)
*H03K 17/955*    (2006.01)

(52) U.S. Cl.
CPC ......... *G06Q 10/087* (2013.01); *H03K 17/955* (2013.01)

(58) Field of Classification Search
CPC ............... G06Q 10/087; H03K 17/955; H03K 2217/960765; H03K 2017/9602; B65G 1/1371
USPC ....................................... 324/658
See application file for complete search history.

(56) References Cited

U.S. PATENT DOCUMENTS

| | | |
|---|---|---|
| 2003/0052778 A1 | 3/2003 | Wong |
| 2005/0190072 A1* | 9/2005 | Brown ............... G06Q 10/087 340/6.1 |
| 2006/0071774 A1 | 4/2006 | Brown et al. |
| 2011/0241831 A1 | 10/2011 | Makiranta et al. |
| 2016/0003759 A1* | 1/2016 | Marashdeh ......... G06T 11/003 324/658 |

(Continued)

FOREIGN PATENT DOCUMENTS

| | | |
|---|---|---|
| DE | 102007031174 A1 | 1/2009 |
| WO | 2010112666 A1 | 10/2010 |

OTHER PUBLICATIONS

International Search Report and Written Opinion issued in corresponding International Patent Application No. PCT/EP2020/069939 dated Oct. 16, 2020 (10 pages).

(Continued)

*Primary Examiner* — Christopher P McAndrew
(74) *Attorney, Agent, or Firm* — Kilyk & Bowersox, P.L.L.C.

(57) ABSTRACT

The invention relates to a container (10) for a goods management system, the system being configured for receiving goods, wherein the container comprises a capacitive sensor device (20) for detecting the presence and/or the filling volume of goods in the container, the capacitive sensor device comprising a conducting path (22) printed on a substrate on at least one boundary wall (11) of the container, which in the FIGURE is formed by its bottom (11). The invention further relates to a goods management system comprising one or more such containers.

6 Claims, 1 Drawing Sheet

(56) References Cited

U.S. PATENT DOCUMENTS

| | | | |
|---|---|---|---|
| 2016/0070017 A1* | 3/2016 | Leek | G01N 27/00 |
| | | | 324/658 |
| 2016/0161623 A1* | 6/2016 | Chacon | A47C 20/041 |
| | | | 324/658 |
| 2016/0283898 A1 | 9/2016 | Reuther et al. | |
| 2017/0278059 A1 | 9/2017 | Aji | |
| 2018/0100754 A1* | 4/2018 | Kumar | G01F 23/266 |
| 2018/0106924 A1* | 4/2018 | Maeda | G01V 3/088 |
| 2020/0253679 A1 | 8/2020 | Mann et al. | |

OTHER PUBLICATIONS

Search Report issued in corresponding Austrian Patent Application No. A 50693/2019 dated Nov. 14, 2019 (1 page).

* cited by examiner

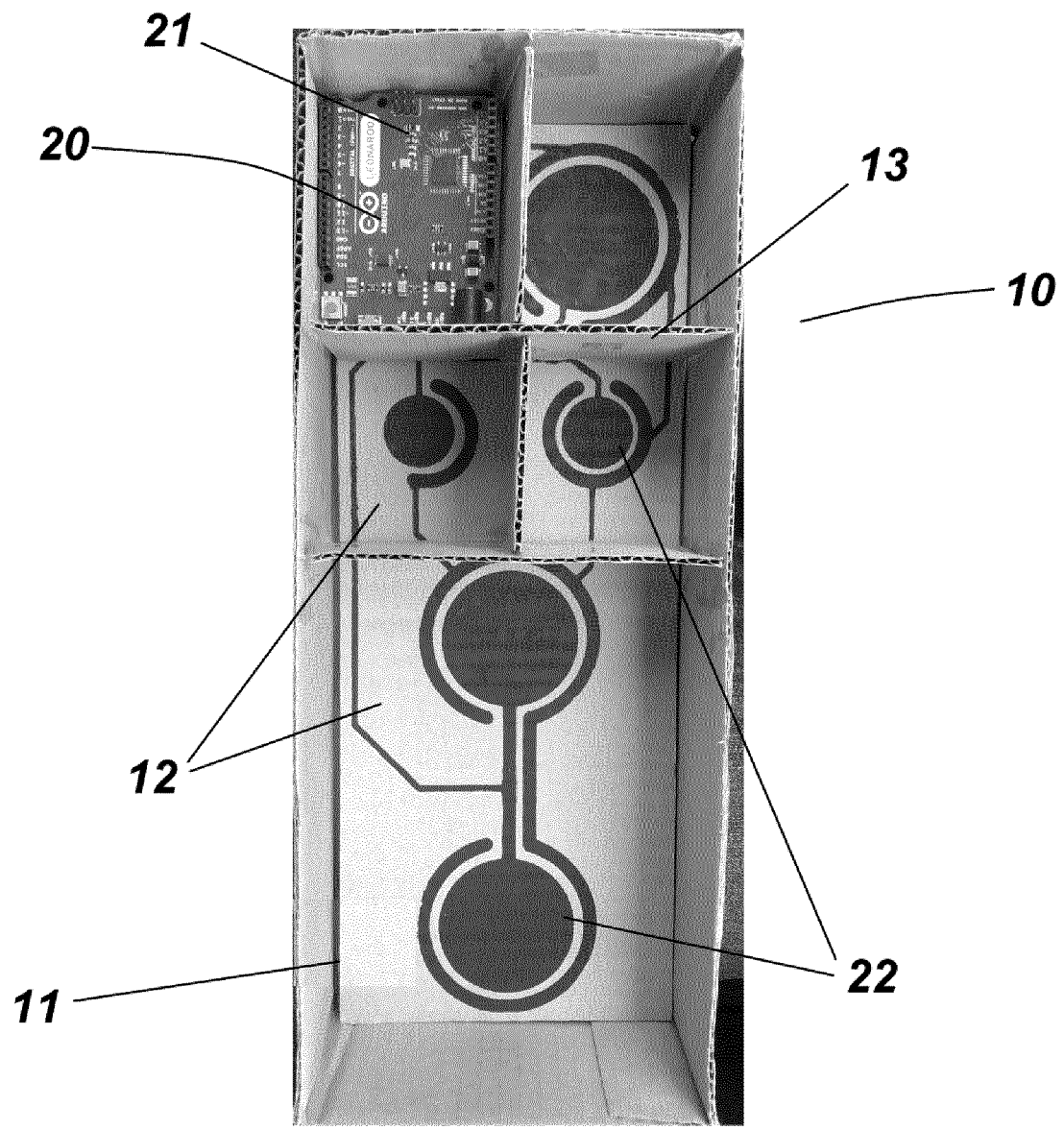

CONTAINER FOR A GOODS MANAGEMENT SYSTEM

This application is a National Stage Application of PCT/EP2020/069939, filed Jul. 15, 2020, which claims priority to Austrian Patent Application No. A 50693/2019, filed Jul. 30, 2019.

The invention relates to a container for a goods management system, which has a capacitive sensor device for detecting the presence and/or the filling volume of goods in the container.

Goods management systems are known from the prior art. They typically comprise a plurality of containers for receiving goods and a storage management unit for the inventory management. From DE 10 200 7 031 174 A1 and DE 10 201 3 222 263 A1, for example, it has been known to equip such systems with sensors for detecting the presence and/or the filling volumes of goods in the containers.

The problem to be solved by the invention is providing containers for such goods management systems, which can be produced in a cost-effect manner and at the same time generate a suitable basis for detecting the presence and/or the filling volumes of goods in the containers.

Against this background, the invention proposes a container for a goods management system, the system being configured for receiving goods, wherein the container comprises a capacitive sensor device for detecting the presence and/or the filling volume of goods in the container, the capacitive sensor device comprising a conducting path printed on a substrate on at least one boundary wall of the container. The conductor paths serve as capacitive measuring surfaces. This enables an inventory status measurement for the goods within the container by simple means.

The respective boundary wall is preferably formed by the bottom of the container. This configuration is advantageous as the goods lying directly on the bottom then lie directly on the measuring surface.

Preferably, the capacitive sensor device comprises two conducting paths printed on the substrate on the boundary wall of the container, wherein one of the conducting paths forms a measuring electrode and the other one of the conducting paths forms a shielding electrode (GND electrode).

In a variant of the invention, the substrate is the surface of the boundary wall. In this variant, the conductive path is hence printed directly onto the boundary wall.

Alternatively, the substrate can be a thin surface element covering the boundary wall. The surface element can be, for example, a thin film having the conductive path printed thereon or a sheet of paper having the conductive path printed thereon, which film or sheet is laminated onto the boundary wall, for example by glueing.

In one embodiment, the conducting path or the conducting paths is/are formed through the printing of electrically conductive ink.

The sensor device can be is configured to periodically carry out periodically capacitive checks of the presence and/or the filling volume of goods in the container. This can be carried out by periodically energizing the conducting paths. The measurement signals can be periodically transmitted to a storage management unit of the goods management system.

The sensor unit can also have a communication interface for transmitting a sensor signal to a storage management unit of the goods management system. Furthermore, the sensor unit can comprise an evaluation unit for digitalizing the sensor signal. In this embodiment, the sensor signal can be transmitted to the storage management unit of the goods management system in digital format.

In one embodiment, the sensor device comprises a plurality of conducting paths or a plurality of pairs of conducting paths forming measuring and shielding electrodes to separately detect, by capacitive measurement, the presence and/or the filling volume of goods in a plurality of areas or compartments of the container. For example, the container can have a plurality of compartments, defined by preferably vertical partition walls inside of the container, for at least part of which the container comprises conducting paths or a plurality of pairs of conducting paths forming measuring and shielding electrodes to separately detect, by capacitive measurement, the presence and/or the filling volume of goods therein.

The container can be, for example, a cardboard box. The paper surface of cardboard is well suited for printing with, for example, electrically conductive ink. Alternatively, plastic boxes, wooden boxes, or the like, can be used.

In another embodiment, the container can form part of a piece of furniture. For example, the container can be formed by a drawer or a compartment of a tool box, of a stocking rack, or of a furniture in a mobile unit, comprising goods stored therein.

In an embodiment, the container, in addition to the capacitive sensor device, comprises a separate property sensing device configured to determine a qualitative property of the goods present. In this embodiment, in addition to the presence or the filling volume, which is determined through the capacitive sensor device, also a qualitative property of the goods present, for example the concentration of a specific ingredient or the like, can be determined. The property sensing device can, for example, comprise an IR spectrometer, an RFID reader, a camera coupled to an image evaluation device, or an electromagnetic sensor system. An IR spectrometer is particularly preferred.

The invention further relates to a goods management system comprising one or more containers according to the invention.

Further details and advantages of the invention become apparent from the exemplary embodiment described below with reference to the FIGURE.

The only FIGURE shows a container according to an embodiment of the invention, which is in the form of a cardboard box 10.

The problem to be solved by the invention is providing containers for such goods management systems, which can be produced in a cost-effect manner and at the same time generate a suitable basis for detecting the presence and/or the filling volumes of goods in the containers.

The key idea of the present invention is the improvement of goods management systems insofar as to facilitate an improvement in the efficiency of stock keeping through enabling automation. In this context, a container in the form of a cardboard box 10 is provided, the box 10 comprising a capacitive sensor device 20 encompassing sensing electronics 21 and conducting paths 22 that are printed on the bottom 1 of the cardboard box 10 with electrically conductive ink, more specifically a plurality of pairs of conducting paths 22 acting as measuring and shielding electrodes of the sensor device 20. The cardboard box 10 comprises a plurality of storage compartments 12, which are separated by vertical walls 13.

The printed conducting paths 22 form capacitive measuring surfaces for detecting the filling status of goods within each individual compartment 12, and the electronics 21 are configured to periodically determine the filling status. If the electronics 21 thereby detect that goods have been removed from the cardboard box 10 or, more specifically, a certain compartment 12, they automatically generate and transmit an order request to a storage management unit of the goods management system (not shown in the FIGURE).

In this context, goods stored in a specific compartment 12, in case they are equipped with an identifier code, for example a UDI (Unique Device Identification) as customary in medicinal products, can qualitatively be identified before storage by scanning the identifier code, for example via a smartphone equipped with an appropriate app. In this way, the storage management unit obtains exact information on the kind of the stored goods. Individual compartments 12 or cardboard boxes 10 could on that basis also be assigned to individual customers.

Possibilities of applications include, for example, storage of medical products. In response to novel medicinal products guidelines, all medicinal products have to comprise a UDI printed on the packaging. This identifier code comprises information on manufacturer, production date, batch and expiry date. When using the system of the invention for processing an order, in the case of a call-back, the manufacturer can access information on the precise storage location of the respective goods and information on whether the product is already in use or is still in stock (traceability).

A further option for application is in retail, where the system of the invention can make stock keeping easier. A possibly automated stock replenishment enables the retailer to keep full stock for the customers. Goods could be invoiced only when actually removed from stock by a customer.

A further option for application is in pharmacies. Implementing a system according to the invention in pharmaceutical stocks enables the stock keeper to monitor the availability and expiry dates of drugs, as long as the goods are scanned and their expiry date is recorded upon putting them into stock.

The container according to the invention can also be in the form of a mobile storage box for craftsmen. If the container is provided in a company car used, for example, by an installer, the use of consumables from within the box can be monitored on a daily basis. If the company car is returned at the end of the working day, the used goods can be refilled.

Furthermore, the container according to the invention can form part of a piece of furniture, and the conducting paths forming the sensor surfaces can be printed directly on furniture components. In this way, pieces of furniture can directly be used for active stock keeping.

The invention claimed is:

1. A container for a goods management system, the system being configured for receiving goods,
    wherein the container is a cardboard, plastic or wooden box,
    wherein the container comprises a capacitive sensor device for detecting the presence and/or the filling volume of goods in the container, the capacitive sensor device comprising a conducting path formed through the printing of electrically conductive ink on a surface of at least one boundary wall of the container;
    wherein the container, in addition to the capacitive sensor device, comprises a separate property sensing device configured to determine a qualitative property of the goods present;
    wherein the sensor device comprises a plurality of conducting paths or a plurality of pairs of conducting paths forming measuring and shielding electrodes to separately detect, by capacitive measurement, the presence and/or the filling volume of goods in a plurality of areas or compartments of the container; and
    wherein the property sensing device comprises an IR spectrometer, an RFID reader, a camera coupled to an image evaluation device, or an electromagnetic sensor system.

2. The container according to claim 1, wherein the capacitive sensor device comprises two conducting paths printed on the substrate on the boundary wall of the container, wherein one of the conducting paths forms a measuring electrode and the other one of the conducting paths forms a shielding electrode.

3. The container according to claim 1, wherein the sensor device is configured to periodically carry out periodically capacitive checks of the presence and/or the filling volume of goods in the container.

4. The container according to claim 1, wherein the sensor device has a communication interface for transmitting a sensor signal to a storage management unit of the goods management system and/or an evaluation unit for digitalizing the sensor signal.

5. A goods management system comprising one or more of the container of claim 1.

6. The container according to claim 1, wherein the property sensing device is the IR spectrometer.

* * * * *